(12) United States Patent
Takeuchi

(10) Patent No.: US 12,501,688 B2
(45) Date of Patent: Dec. 16, 2025

(54) CMOS CIRCUIT HAVING TRANSMISSION CIRCUIT CONNECTED TO OUTPUT TERMINAL OF LOGICAL OPERATION CIRCUIT

(71) Applicant: Japan Aerospace Exploration Agency, Chofu (JP)

(72) Inventor: Kozo Takeuchi, Chofu (JP)

(73) Assignee: JAPAN AEROSPACE EXPLORATION AGENCY (JP)

( * ) Notice: Subject to any disclaimer, the term of this patent is extended or adjusted under 35 U.S.C. 154(b) by 429 days.

(21) Appl. No.: 18/004,559

(22) PCT Filed: Aug. 5, 2021

(86) PCT No.: PCT/JP2021/029176
§ 371 (c)(1),
(2) Date: Jan. 6, 2023

(87) PCT Pub. No.: WO2022/030596
PCT Pub. Date: Feb. 10, 2022

(65) Prior Publication Data
US 2023/0253265 A1 Aug. 10, 2023

(30) Foreign Application Priority Data
Aug. 7, 2020 (JP) .................. 2020-134718

(51) Int. Cl.
*H10D 84/03* (2025.01)
*H03K 19/0948* (2006.01)
(Continued)

(52) U.S. Cl.
CPC ....... *H10D 84/038* (2025.01); *H03K 19/0948* (2013.01); *H10D 84/0191* (2025.01); *H10D 84/859* (2025.01)

(58) Field of Classification Search
CPC ............. H10D 84/038; H10D 84/0191; H10D 84/859; H03K 19/0948
See application file for complete search history.

(56) References Cited

U.S. PATENT DOCUMENTS 5,706,226 A * 1/1998 Chan ...................... H10B 10/12
257/E27.099
5,841,694 A * 11/1998 Wong ................ H03K 19/17792
365/185.21
(Continued)

FOREIGN PATENT DOCUMENTS

JP S 63-166259 A 7/1988
JP 2000-196429 A 7/2000
(Continued)

OTHER PUBLICATIONS

Office Action mailed Apr. 30, 2024, issued in corresponding Japanese Patent Application No. 2020-134718 and English translation.
(Continued)

*Primary Examiner* — Michael Jung
(74) *Attorney, Agent, or Firm* — OSTROLENK FABER LLP

(57) ABSTRACT

In a complementary metal oxide semiconductor (CMOS) circuit formed on a substrate of a first conductivity type, a first logical operation circuit includes a combination of a first transistor of the first conductivity type having a first well of a second conductivity type different from the first conductivity type and a second transistor of the second conductivity type having a second well of the first conductivity type and a transmission circuit is connected to an output terminal of the first logical operation circuit and includes one or both of a third transistor of the first conductivity type and a fourth transistor of the second conductivity type. Each of gate terminals of the third transistor and the fourth transistor is connected to a well of a transistor of (Continued)

a different conductivity type between the first transistor and the second transistor or an output terminal of a second logical operation circuit.

7 Claims, 10 Drawing Sheets

(51) Int. Cl.
  *H10D 84/01* (2025.01)
  *H10D 84/85* (2025.01)

(56) References Cited

U.S. PATENT DOCUMENTS

| | | | | |
|---|---|---|---|---|
| 6,670,829 | B1* | 12/2003 | Chow | H03K 17/6872 |
| | | | | 326/27 |
| 9,748,955 | B1* | 8/2017 | Gasiot | H10D 84/0191 |
| 2014/0160840 | A1* | 6/2014 | Chen | G11C 11/419 |
| | | | | 365/182 |
| 2021/0305809 | A1* | 9/2021 | Hung | H10D 89/911 |

FOREIGN PATENT DOCUMENTS

| | | |
|---|---|---|
| JP | 2001-148627 A | 5/2001 |
| JP | 2003-060087 A | 2/2003 |
| JP | 2004-048170 A | 2/2004 |
| JP | 2005-523625 A | 8/2005 |
| JP | 2006-054780 A | 2/2006 |
| JP | WO 2007/108406 A1 | 8/2009 |
| WO | WO 03/090229 A2 | 10/2003 |

OTHER PUBLICATIONS

International Search Report mailed Sep. 28, 2021 in corresponding PCT International Application No. PCT/JP2021/029176.
S.Mitra et. al., Robust system design with built-in soft-error resilience, IEEE Computer Society, vol. 38, No. 2, pp. 43-52, Feb. 2005, doi: 10.1109/MC. 2005.70.
Office Action mailed Sep. 24, 2024, issued in corresponding Japanese Patent Application No. 2020-134718 with English translation.
Notice of Allowance mailed Jan. 21, 2025, issued in corresponding Japanese Patent Application No. 2020-134718 and its English translation.

* cited by examiner

CMOS CIRCUIT HAVING TRANSMISSION CIRCUIT CONNECTED TO OUTPUT TERMINAL OF LOGICAL OPERATION CIRCUIT

CROSS-REFERENCE TO RELATED APPLICATIONS

The present application is a 35 U.S.C. § 371 national stage application of International Application No. PCT/JP2021/029176, filed Aug. 5, 2021, which claims priority to Japanese Patent Application No. 2020-134718, filed Aug. 7, 2020, the contents of which are incorporated herein by reference.

TECHNICAL FIELD

The present invention relates to a complementary metal oxide semiconductor (CMOS) circuit.

Priority is claimed on Japanese Patent Application No. 2020-134718, filed Aug. 7, 2020, the content of which is incorporated herein by reference.

BACKGROUND ART

In the related art, for example, semiconductor integrated circuits such as a CMOS-type large scale integration (LSI) circuit, an application specific integrated circuit (ASIC), a field-programmable gate array (FPGA), and a graphics processing unit (GPU) are used in various types of equipment and devices. In a CMOS-type semiconductor integrated circuit, a circuit is formed by connecting a plurality of circuit elements such as transistors formed on a semiconductor substrate (for example, a silicon substrate) to implement a function of performing necessary operations.

For example, CMOS-type semiconductor integrated circuits for use in outer space, such as satellites orbiting the earth, are used in environments where radiation such as high-energy charged particles is incident. Furthermore, it is known that CMOS-type semiconductor integrated circuits for terrestrial use are also affected by radiation such as neutrons. Radiation incident on a CMOS-type semiconductor integrated circuit is known to cause malfunctions of circuit elements formed on a semiconductor substrate. More specifically, it is known that, when high-energy charged particles are incident on a CMOS-type semiconductor integrated circuit, for example, potential fluctuations (so-called single event transient: SET), erroneous data storage (so-called single event upset: SEU) due to the propagation of signals affected by the potential fluctuations, and the like, occur.

In the related art, various technologies for taking countermeasures against single events such as single event transients and single event upsets have been disclosed (see Patent Document 1 and Non-Patent Document 1). For example, Patent Document 1 discloses that a single event malfunction caused by high-energy charged particles is prevented from propagating to a subsequent stage by forming circuit elements in a double structure (vertical lamination structure). For example, Non-Patent Document 1 discloses technology related to the design (structure) of an embedded circuit element with enhanced resistance (robustness) to single event errors (soft errors).

CITATION LIST

Patent Document

[Patent Document 1]
Japanese Unexamined Patent Application, First Publication No. 2004-048170

Non-Patent Document

[Non-Patent Document 1]
S. Mitra, N. Seifert, M. Zhang, Q. Shi, K. S. Kim, "Robust system design with built-in soft-error resilience," IEEE Computer Society, vol. 38, no. 2, pp. 43-52, February 2005, doi: 10.1109/MC. 2005.70.

SUMMARY OF INVENTION

Technical Problem

However, technology disclosed in Patent Document 1 is effective only when circuit elements are formed on a semiconductor substrate having a silicon on insulator (SOI) structure. The semiconductor substrate having the SOI structure has a structure in which an insulating layer is provided inside of the substrate and therefore is more expensive than, for example, a silicon single crystal substrate (a so-called bulk substrate). Furthermore, in recent years, the microfabrication of a process of manufacturing CMOS-type semiconductor integrated circuits has progressed. Thus, circuit elements to which the conventional technology is applied cannot be expected to have the effect of countermeasures against a single event with the microfabrication of the manufacturing process. This is because countermeasures against single events are taken by providing a spatial distance between components constituting the circuit element in the conventional technology, but circuit elements formed on the semiconductor substrate become smaller when the microfabrication of the manufacturing process is performed, it is difficult to ensure the necessary distance between the components, and the effect of countermeasures against single events based on the conventional technology is nullified.

The present invention has been made based on the recognition of the above problem and an objective of the present invention is to provide a CMOS circuit having high resistance to a single event.

Solution to Problem

According to an aspect of the present invention for achieving the aforementioned objective, there is provided a CMOS circuit including a first logical operation circuit formed on a substrate of a first conductivity type and a transmission circuit for transmitting a signal of an output terminal of the first logical operation circuit, wherein the first logical operation circuit includes a combination of a first transistor of the first conductivity type having a first well of a second conductivity type different from the first conductivity type and a second transistor of the second conductivity type having a second well of the first conductivity type, wherein the transmission circuit is connected to the output terminal of the first logical operation circuit and includes one or both of a third transistor of the first conductivity type and a fourth transistor of the second conductivity type, and wherein each of gate terminals of the third transistor and the fourth transistor is connected to a well of a transistor of a different conductivity type between the first transistor and the second transistor or an output terminal of a second logical operation circuit that includes a combination of a fifth transistor of the first conductivity type having the first well and a sixth transistor of the second conductivity type having the second well and that has an input terminal fixed to a prescribed potential.

Advantageous Effects of Invention

According to an aspect of the present invention, it is possible to increase the resistance to a single event in a CMOS circuit.

DESCRIPTION OF EMBODIMENTS

Embodiments of a complementary metal oxide semiconductor (CMOS) circuit of the present invention will be described below with reference to the drawings. As used throughout this disclosure, when this application is translated from Japanese to English, the singular forms "a," "an," and "the" may include a plurality of preferences unless the context clearly dictates otherwise. The CMOS circuit of the embodiment is, for example, a single logical operation circuit that performs logical operations such as a logical negation circuit (a NOT circuit or an inverter circuit), a logical sum circuit (an OR circuit), a logical product circuit (an AND circuit), a negative logical sum circuit (a NOR circuit), a negative logical product circuit (a NAND circuit), an exclusive logical sum circuit (an EXOR circuit), or a negative exclusive logical sum circuit (an EXNOR circuit). The CMOS circuit of the embodiment can also be configured to hold data (a signal level), for example, as in a latch circuit, a flip-flop circuit, or the like, by combining a plurality of single logical operation circuits. Furthermore, the CMOS circuit of the embodiment can also be configured to store (memorize) data (a signal level), for example, as in a static random access memory (SRAM) or the like, by combining a plurality of single logical operation circuits, flip-flop circuits, transmission gate circuits, and the like.

First Embodiment

In the following description, for ease of description, a logical negation circuit (hereinafter referred to as an "inverter circuit"), which is a logical operation circuit with the simplest configuration, will be described as an example of the CMOS circuit of the first embodiment.

[Configuration of Inverter Circuit]

Figure 1:
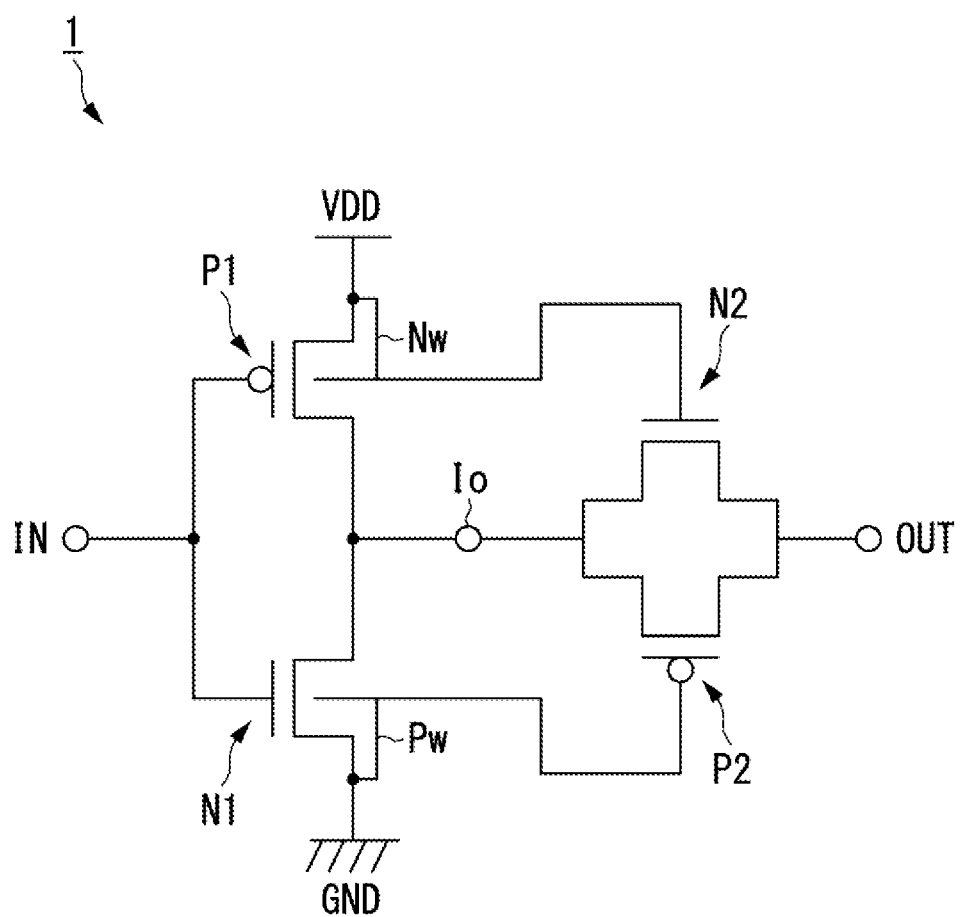
FIG. 1 is a diagram showing an example of a configuration of a CMOS circuit according to a first embodiment.

FIG. 1 is a diagram showing an example of a configuration of a CMOS circuit (an inverter circuit) according to the first embodiment. An inverter circuit 1 includes a P-channel MOS transistor P1, an N-channel MOS transistor N1, a P-channel MOS transistor P2, and an N-channel MOS transistor N2. The inverter circuit 1 shown in FIG. 1 is an example in which each transistor is formed on a P-type single crystal semiconductor substrate (bulk substrate).

The P-channel MOS transistor P1 has a gate terminal connected to an input terminal IN of the inverter circuit 1, a source terminal connected to a power supply VDD, and a drain terminal connected to a drain terminal of the N-channel MOS transistor N1. The N-channel MOS transistor N1 has a gate terminal connected to the input terminal IN of the inverter circuit 1, a source terminal connected to the ground GND, and the drain terminal connected to the drain terminal of the P-channel MOS transistor P1. The P-channel MOS transistor P2 has a gate terminal connected to a P-well Pw of the N-channel MOS transistor N1 (a body of the N-channel MOS transistor N1 in FIG. 1), a source terminal connected to the drain terminals of the P-channel MOS transistor P1 and the N-channel MOS transistor N1, and a drain terminal connected to an output terminal OUT of the inverter circuit 1. The N-channel MOS transistor N2 has a gate terminal connected to an N-well Nw of the P-channel MOS transistor P1 (a body of the P-channel MOS transistor P1 in FIG. 1), a source terminal connected to the drain terminals of the P-channel MOS transistor P1 and the N-channel MOS transistor N1, and a drain terminal connected to the output terminal OUT of the inverter circuit 1. The gate terminals of the P-channel MOS transistor P2 and the N-channel MOS transistor N2 and the corresponding wells may be connected by, for example, well contact and the like.

In the inverter circuit 1, a configuration of the P-channel MOS transistor P1 and the N-channel MOS transistor N1 is a configuration of a basic logical negation circuit (an inverter circuit) in a general logical operation circuit. In the following description, an inverter circuit having a basic configuration including the P-channel MOS transistor P1 and the N-channel MOS transistor N1 is referred to as a "NOT circuit" to distinguish it from the inverter circuit 1 of the first embodiment. In the inverter circuit 1, a configuration of the P-channel MOS transistor P2 and the N-channel MOS transistor N2 is a configuration of a basic transmission gate circuit in a general semiconductor circuit. In other words, the inverter circuit 1 has a configuration including a basic configuration of a NOT circuit and a transmission gate circuit and an output terminal node (hereinafter referred to as an "internal node Io") of the NOT circuit is connected to an input terminal of the transmission gate circuit.

A P-type single crystal semiconductor substrate is an example of a "substrate of a first conductivity type" in the claims. The P-channel MOS transistor P1 is an example of a "first transistor" in the claims and the N-channel MOS transistor N1 is an example of a "second transistor" in the claims. The N-well Nw is an example of a "first well" in the claims and the P-well Pw is an example of a "second well" in the claims. A P-type or a P-channel is an example of the "first conductivity type" in the claims and an N-type or an N-channel is an example of a "second conductivity type" in the claims. The NOT circuit is an example of a "first logical operation circuit" in the claims. The P-channel MOS transistor P2 is an example of a "third transistor" in the claims and the N-channel MOS transistor N2 is an example of a "fourth transistor" in the claims. The transmission gate circuit is an example of a "transmission circuit" in the claims.

[Operation of Inverter Circuit]

Figure 2:
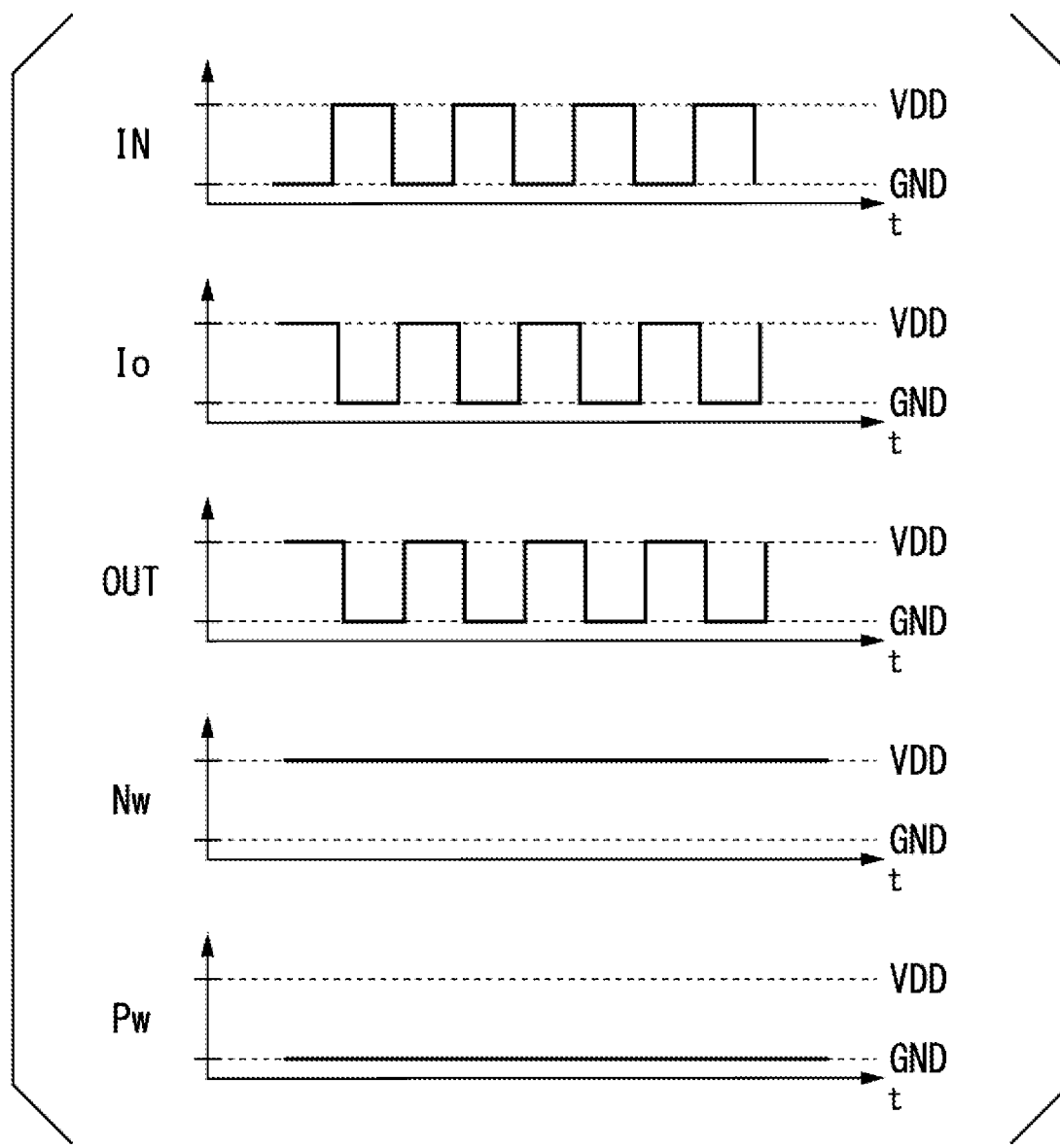
FIG. 2 is a timing chart showing an example of a normal operation in the CMOS circuit according to the first embodiment.

An operation timing of the inverter circuit 1 will now be described. First, a normal operation of the inverter circuit 1 will be described. FIG. 2 is a timing chart showing an example of the normal operation in the CMOS circuit (the inverter circuit 1) according to the first embodiment. FIG. 2 is a timing chart of a normal state in which no high-energy charged particles of radiation are incident on the inverter circuit 1. In the following description, a "High" level of each signal in the inverter circuit 1 is assumed to be a level of the power supply VDD (hereinafter referred to as a "VDD level") and a "Low" level is assumed to be a level of the ground GND (hereinafter referred to as a "GND level").

In FIG. 2, a timing at which a signal of each of the input terminal IN, the internal node Io, the output terminal OUT, the N-well Nw, and the P-well Pw changes and its signal level in the case where an input signal has been input to the input terminal IN of the inverter circuit 1 with the signal level changed between the VDD level and the GND level at prescribed time intervals are shown.

In the normal operation of the inverter circuit 1, the input signal input to the input terminal IN is inverted at a timing delayed by a prescribed delay time in the NOT circuit and output to the internal node Io. In the inverter circuit 1, the N-well Nw is at the VDD level and the P-well Pw is at the GND level. Accordingly, the P-channel MOS transistor P2 and the N-channel MOS transistor N2 of the transmission gate circuit are in an ON state all the time. Thus, the signal (hereinafter referred to as an "internal signal") output to the internal node Io by the NOT circuit in the normal operation of the inverter circuit 1 is transmitted at a timing delayed by a prescribed delay time in the transmission gate circuit and is output to the output terminal OUT.

Thus, in the normal operation of the inverter circuit 1, the internal signal output by the NOT circuit is transmitted by the transmission gate circuit and output as an output signal to the output terminal OUT. In other words, in the normal operation of the inverter circuit 1, the input signal input to the input terminal IN of the inverter circuit 1 is inverted and output to the output terminal OUT as in a general logical negation circuit.

Figure 3:
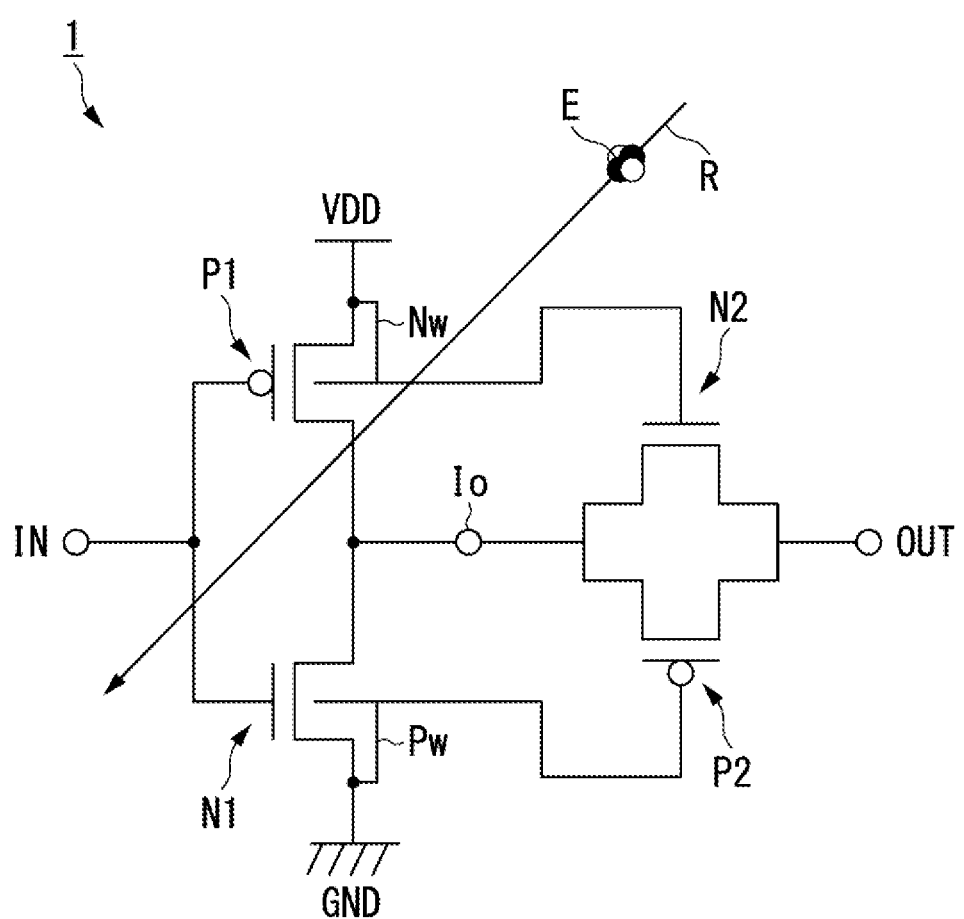
FIG. 3 is a diagram schematically showing an example of a state in which high-energy charged particles are incident on the CMOS circuit according to the first embodiment.

Next, an operation when high-energy charged particles of radiation are incident on the inverter circuit 1 will be described. FIG. 3 is a diagram schematically showing an example of a state in which high-energy charged particles are incident on the CMOS circuit (the inverter circuit 1) according to the first embodiment. In FIG. 3, a case where high-energy charged particles E of radiation R are incident on the NOT circuit constituting the inverter circuit 1 is shown. Due to the incident charged particles E, a single event transient corresponding to the charge of the incident charged particles E also occurs in the inverter circuit 1. It is known that incident charged particles E have a greater influence on a transistor in the OFF state than on a transistor in the ON state.

Figure 4:
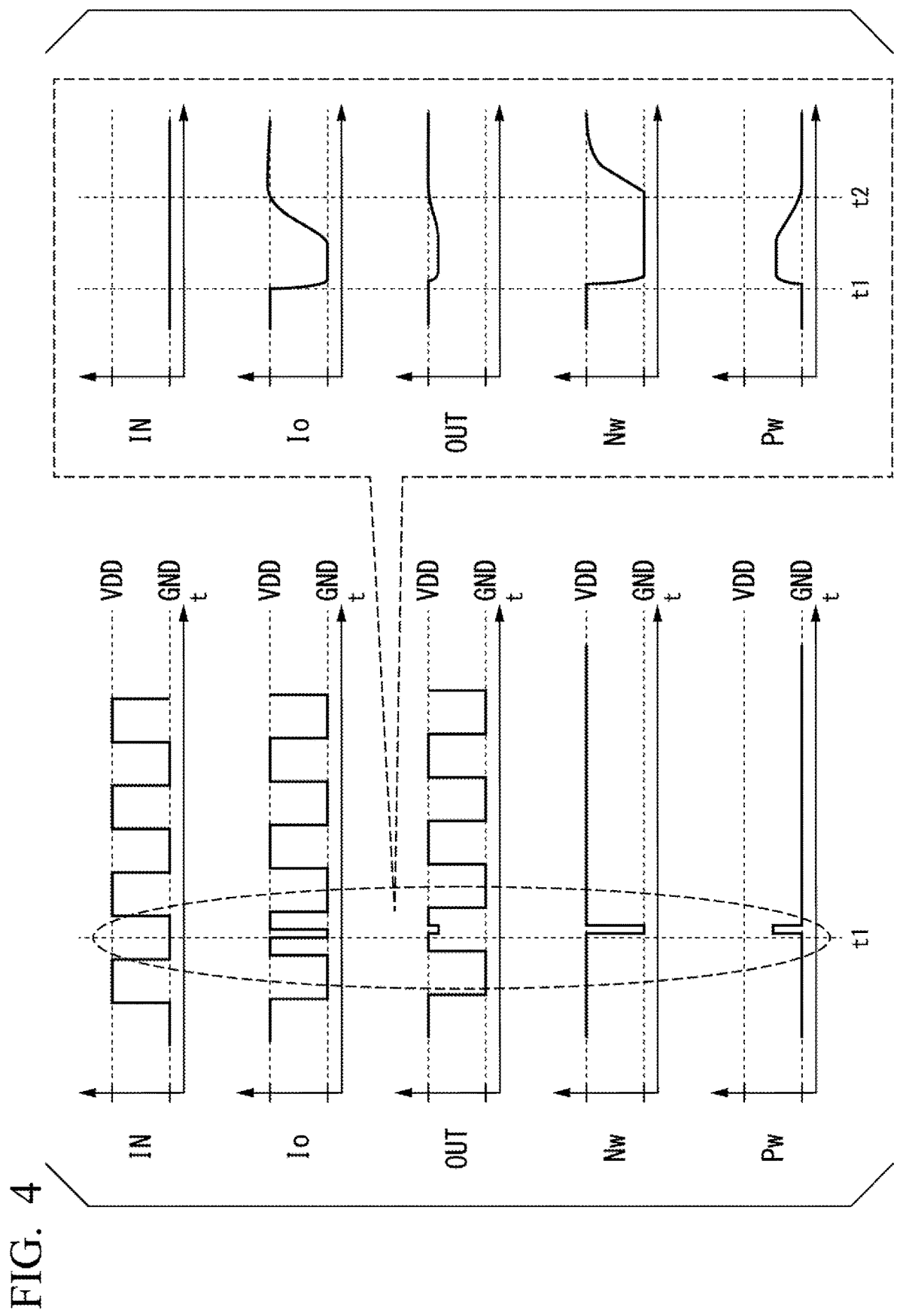
FIG. 4 is a timing chart showing an example of an operation when a single event has occurred due to high-energy charged particles incident on the CMOS circuit according to the first embodiment.
Figure 5:
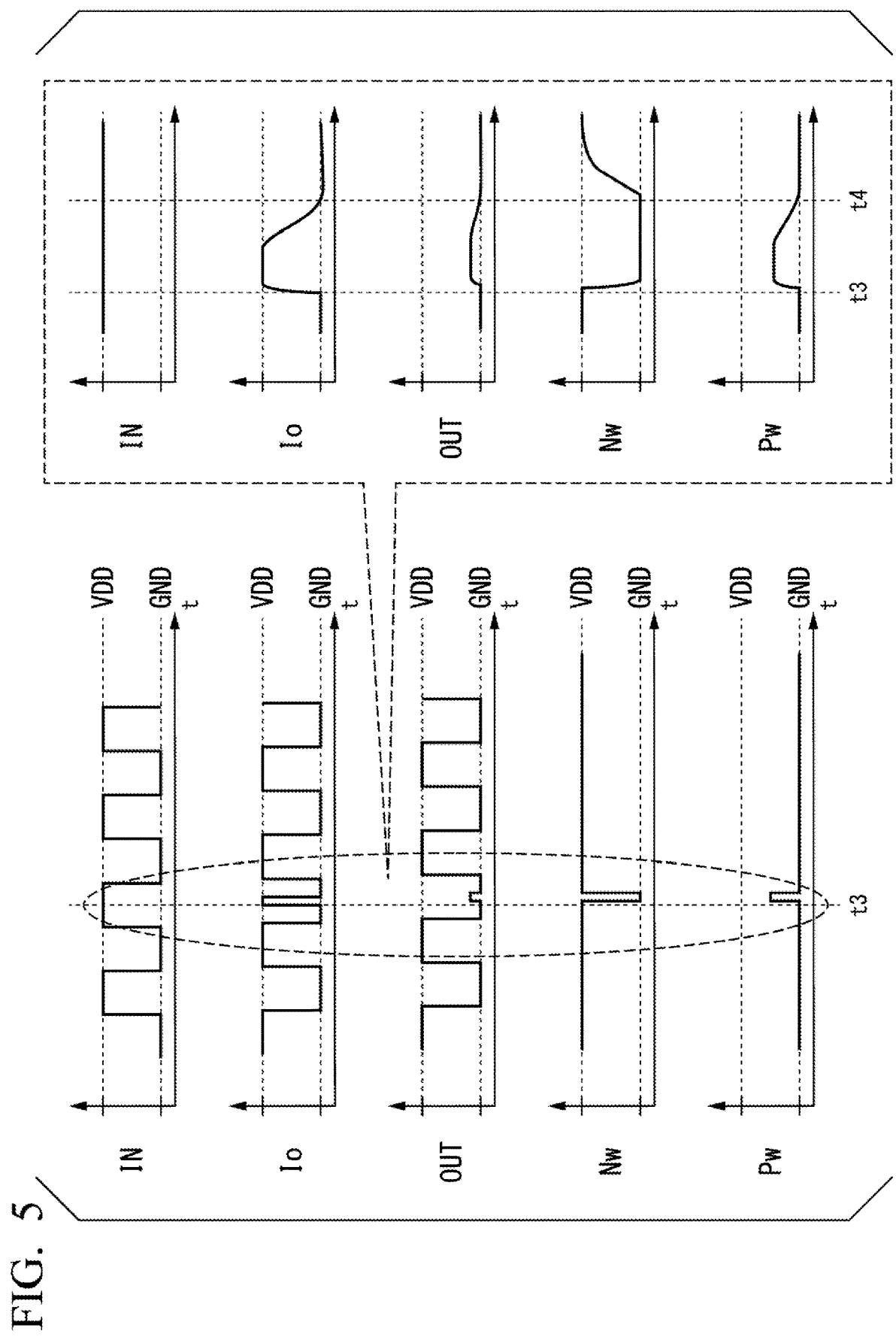
FIG. 5 is a timing chart showing another example of an operation when a single event has occurred due to high-energy charged particles incident on the CMOS circuit according to the first embodiment.

FIGS. 4 and 5 are timing charts showing an example of an operation when a single event has occurred due to high-energy charged particles incident on the CMOS circuit (the inverter circuit 1) according to the first embodiment. FIG. 4 is a timing chart of the case where charged particles E are incident when a GND level signal has been input to the input terminal IN of the inverter circuit 1 and FIG. 5 is a timing chart of the case where charged particles E are incident when a VDD level signal has been input to the input terminal IN of the inverter circuit 1.

First, the timing chart shown in FIG. 4 will be described. If the charged particles E are incident on the NOT circuit at timing t1 when the signal of the GND level is input to the input terminal IN of the inverter circuit 1, the potential of the N-channel MOS transistor N1 in the OFF state constituting the NOT circuit changes transiently in accordance with the charge of the charged particles E. Thereby, an instantaneous pulse of the GND level at the internal node Io that is the output signal of the NOT circuit appears. This is a single event transient.

On the right side of FIG. 4, a period in which the single event transient occurred is enlarged to show the more detailed timing and its signal level. With the occurrence of the single event transient, for example, the potential level of the N-well Nw decreases and the potential level of the P-well Pw increases. On the right side of FIG. 4, an example in which the potential level of the N-well Nw drops to the GND level and the potential level of the P-well Pw rises to a level between the VDD level and the GND level is shown. A difference in the amount of change in the potential level in each well shown on the right side of FIG. 4 is an example based on the assumption that the potential level of the N-well Nw changes more greatly than that of the P-well Pw because the semiconductor substrate that forms the CMOS circuit is a P-type single crystal semiconductor substrate and the amount of change in the potential level in each well is considered to change, for example, in accordance with the charge of the charged particles E.

The N-channel MOS transistor N2 constituting the transmission gate circuit is turned off due to a decrease in the potential level of the N-well Nw and the P-channel MOS transistor P2 constituting the transmission gate circuit is turned off due to an increase in the potential level of the P-well Pw. That is, the transmission gate circuit is turned off. On the right side of FIG. 4, the transmission gate circuit is turned off from timing t1 to timing t2. Thereby, the transmission gate circuit does not transmit (output) an internal signal including a single event transient output to the internal node Io by the NOT circuit to an output terminal OUT as it is. In other words, the transmission gate circuit eliminates the transmission (output) to the output terminal OUT of the single event transient included in the internal signal output to the internal node Io by the NOT circuit. Alternatively, the transmission gate circuit reduces the single event transient included in the internal signal output to the internal node Io by the NOT circuit and transmits (outputs) the internal signal including the reduced single event transient to the output terminal OUT On the right side of FIG. 4, an example in which the single event transient included in the internal signal of the internal node Io is reduced and the internal signal including the reduced single event transient is transmitted (output) to the output terminal OUT is shown.

Next, the timing chart shown in FIG. 5 will be described. If the charged particles E are incident on the NOT circuit at timing t3 when a VDD level signal has been input to the input terminal IN of the inverter circuit 1, the potential of the P-channel MOS transistor P1 in the OFF state constituting the NOT circuit changes in accordance with the charge of the incident charged particles E. Thereby, the instantaneous pulse of the VDD level at the internal node Io that is the output signal of the NOT circuit appears.

On the right side of FIG. 5, the period in which the single event transient occurred is enlarged to show the more detailed timing and its signal level. With the occurrence of the single event transient, the transmission gate circuit is turned off as in the case where charged particles E are incident on the NOT circuit when a GND level signal has been input to the input terminal IN of the inverter circuit 1 shown in FIG. 4. On the right side of FIG. 5, the transmission gate circuit is turned off from timing t3 to timing t4. Thereby, the transmission gate circuit does not transmit (output) the internal signal including the single event transient output to the internal node Io by the NOT circuit to the output terminal OUT as it is. On the right side of FIG. 5, an example in which the single event transient included in the internal signal of the internal node Io is reduced and the internal signal including the reduced single event transient is transmitted (output) to the output terminal OUT is shown.

In this way, in the inverter circuit 1, the internal signal of the internal node Io including the single event transient generated in the NOT circuit by the incident charged particle E is not output to the output terminal OUT by turning off the transmission gate circuit. In other words, in the inverter circuit 1, the single event transient output to the output terminal OUT is eliminated or reduced by the transmission gate circuit that is turned off by the charged particles E that are incident. Thereby, in the inverter circuit 1, a single event transient generated inside of the inverter circuit 1 is prevented from propagating to, for example, another CMOS circuit connected to a stage subsequent to the inverter circuit 1. Thereby, in the CMOS semiconductor integrated circuit including the inverter circuit 1, it is possible to prevent a single event upset in which erroneous data is stored due to propagation of a signal including a single event transient that has occurred. In other words, it is possible to increase the resistance to a single event that occurs when charged particles E are incident on the CMOS circuit.

[Configuration of Other CMOS Circuits]

Figure 6:
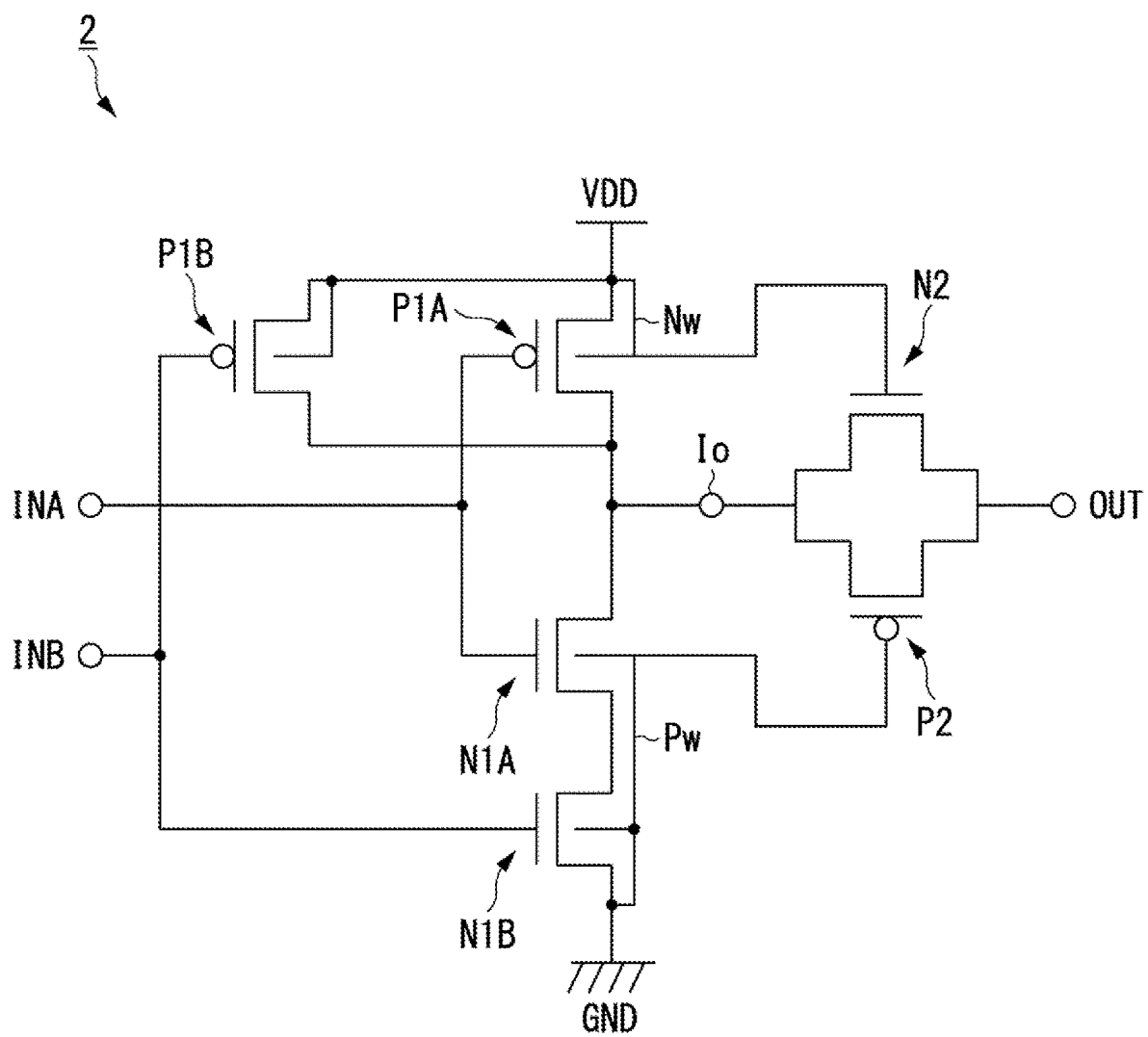
FIG. 6 is a diagram showing another example of the configuration of the CMOS circuit according to the first embodiment.
Figure 7:
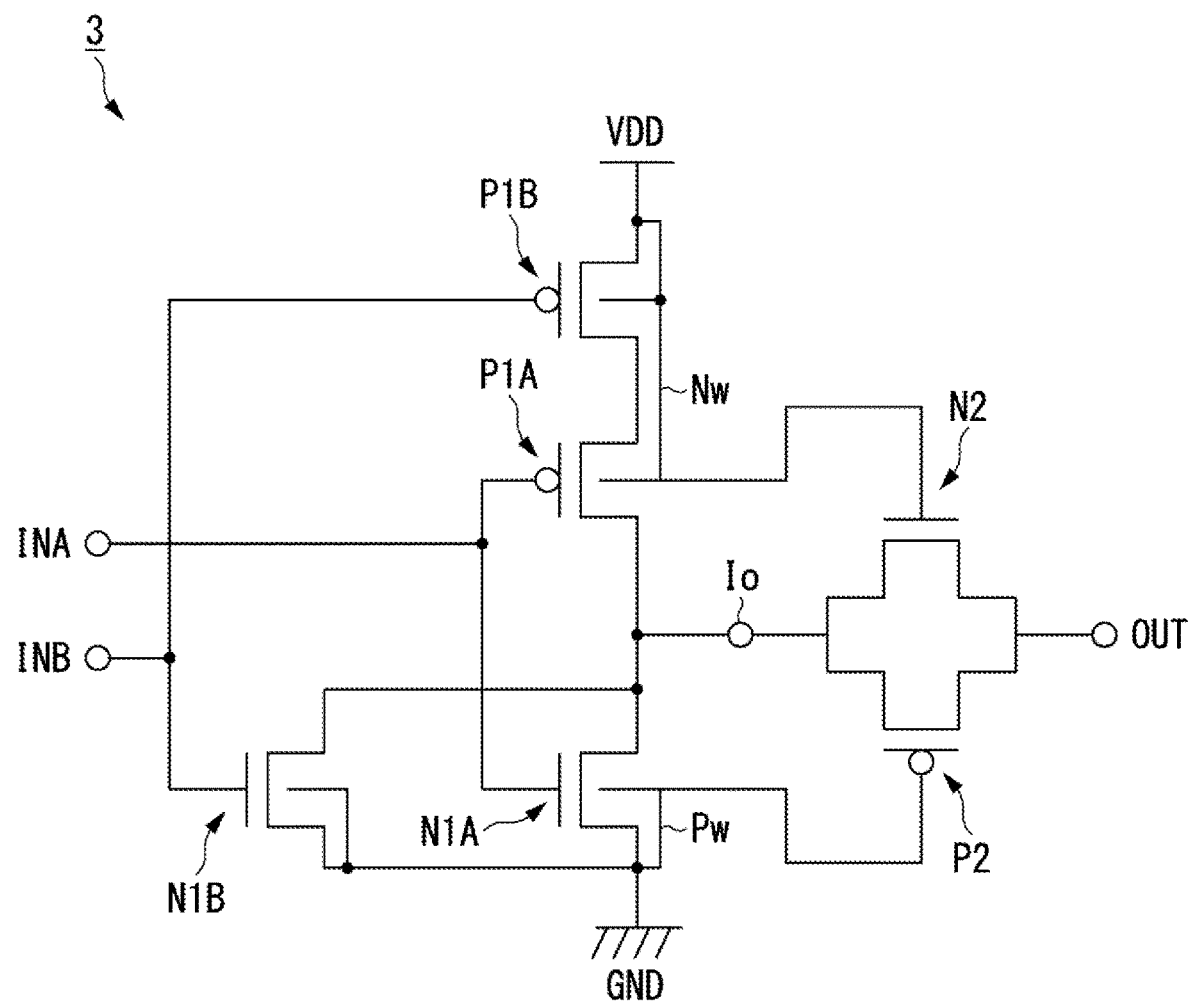
FIG. 7 is a diagram showing another example of the configuration of the CMOS circuit according to the first embodiment.
Figure 8:
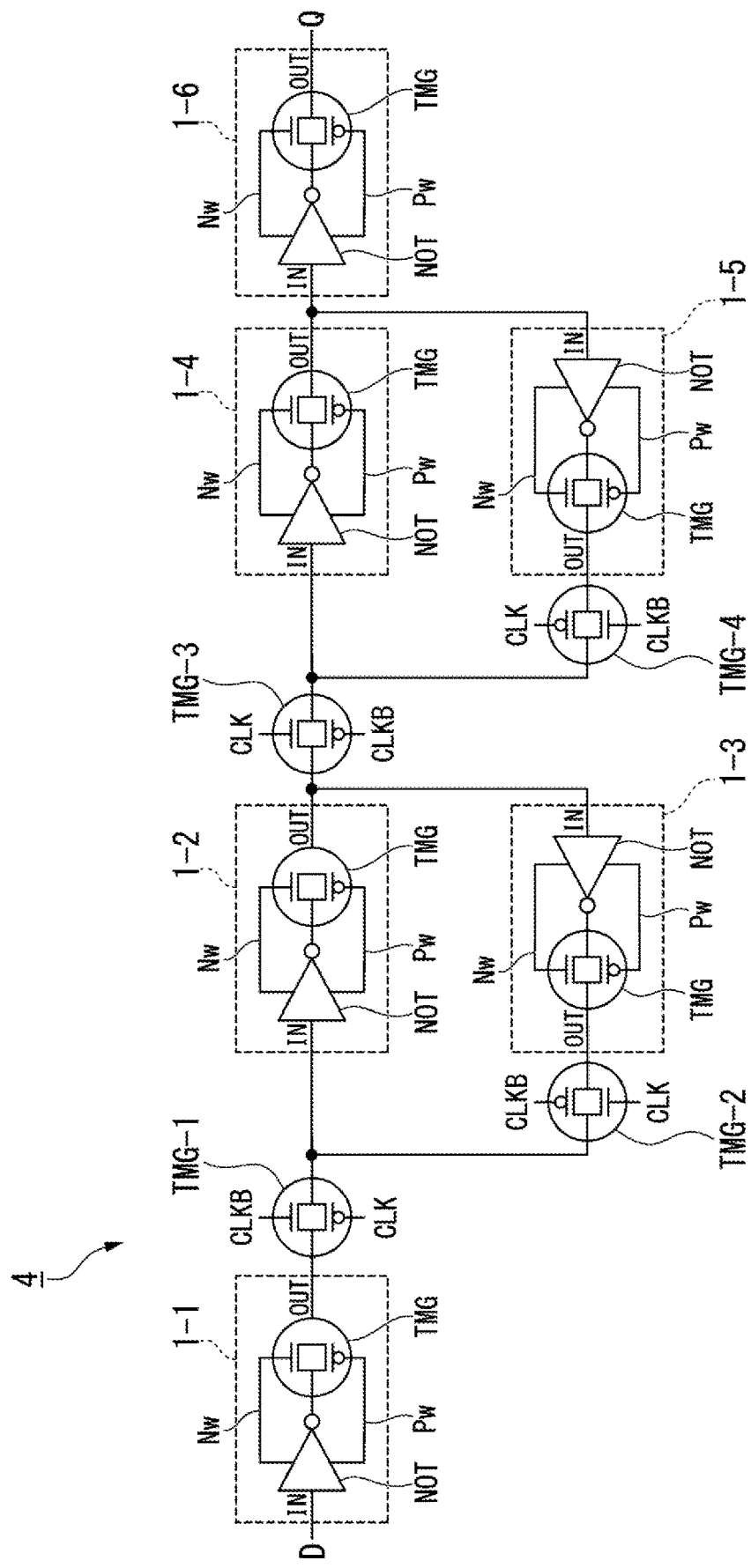
FIG. 8 is a diagram showing another example of the configuration of the CMOS circuit according to the first embodiment.

In the above description, the inverter circuit 1 has been described as an example of the CMOS circuit of the first embodiment. However, the CMOS circuit of the first embodiment may have another configuration different from that of the inverter circuit 1. An example of the configuration of a CMOS circuit other than the inverter circuit 1 in the CMOS circuit of the first embodiment will be described below. FIGS. 6 to 8 are diagrams showing another example of the configuration of the CMOS circuit according to the first embodiment.

FIG. 6 is an example of a two-input negative logical product circuit (NAND circuit). ANAND circuit 2 includes a P-channel MOS transistor P1A, a P-channel MOS transistor P1B, an N-channel MOS transistor N1A, an N-channel MOS transistor N1B, a P-channel MOS transistor P2, and an N-channel MOS transistor N2. The NAND circuit 2 shown in FIG. 6 is an example in which each transistor is formed on a P-type single crystal semiconductor substrate.

In the NAND circuit 2, the configuration of the P-channel MOS transistor P1A, the P-channel MOS transistor P1B, the N-channel MOS transistor N1A, and the N-channel MOS transistor N1B is a configuration of a basic negative logical product circuit (NAND circuit) in a general logical operation circuit. In the NAND circuit 2, the configuration of the P-channel MOS transistor P2 and the N-channel MOS transistor N2 is similar to that of the transmission gate circuit in the inverter circuit 1. In other words, the NAND circuit 2 has a basic configuration of a NAND circuit and a transmission gate circuit and the internal node Io of the output terminal of the NAND circuit is connected to the input terminal of the transmission gate circuit. In the NAND circuit 2, the gate terminal of the P-channel MOS transistor P2 is connected to the P-well Pw common to the N-channel MOS transistors N1A and N1B and the gate terminal of the N-channel MOS transistor N2 is connected to the N-well Nw common to the P-channel MOS transistors P1A and P1B. A connection between the gate terminal of the P-channel MOS transistor P2 and the P-well Pw common to the N-channel MOS transistors N1A and N1B and a connection between the gate terminal of the N-channel MOS transistor N2 and the N-well Nw common to the P-channel MOS transistors P1A and P1B may be made by, for example, well contact and the like.

The P-channel MOS transistor P1A and the P-channel MOS transistor P1B are examples of a "first transistor" in the claims and the N-channel MOS transistor N1A and the N-channel MOS transistor N1B are examples of a "second transistor" in the claims. A basic NAND circuit is an example of a "first logical operation circuit" in the claims.

Even in the NAND circuit 2, in the normal operation, an output signal corresponding to input signals input to an input terminal INA and an input terminal INB of the NAND circuit 2 is output to the output terminal OUT as in the general negative logical product circuit. Even in the NAND circuit 2, as in the inverter circuit 1, the transmission (output) of an internal signal including a single event transient generated in one of the transistors in the OFF state in accordance with the incident high-energy charged particles E to the output terminal OUT is eliminated or reduced by the transmission gate circuit that is turned off by the incident charged particles E.

FIG. 7 is an example of a two-input negative logical sum circuit (NOR circuit). ANOR circuit 3 includes a P-channel MOS transistor P1A, a P-channel MOS transistor P1B, an N-channel MOS transistor N1A, an N-channel MOS transistor N1B, a P-channel MOS transistor P2, and an N-channel MOS transistor N2. The NOR circuit 3 shown in FIG. 7 is an example in which each transistor is formed on a P-type single crystal semiconductor substrate.

In the NOR circuit 3, the configuration of the P-channel MOS transistor P1A, the P-channel MOS transistor P1B, the N-channel MOS transistor N1A, and the N-channel MOS transistor N1B is a configuration of a basic negative logical sum circuit (NOR circuit) in a general logical operation circuit. In the NOR circuit 3, the configuration of the P-channel MOS transistor P2 and the N-channel MOS transistor N2 is similar to a configuration of the transmission gate circuit in the inverter circuit 1. That is, the NOR circuit 3 has a basic configuration of a NOR circuit and a transmission gate circuit and the internal node Io of the output terminal of the NOR circuit is connected to the input terminal of the transmission gate circuit. In the NOR circuit 3, the gate terminal of the P-channel MOS transistor P2 is connected to the P-well Pw common to the N-channel MOS transistors N1A and N1B and the gate terminal of the N-channel MOS transistor N2 is connected to the N-well Nw common to the P-channel MOS transistors P1A and P1B.

The basic NOR circuit is an example of a "first logical operation circuit" in the claims.

Even in the NOR circuit 3, in the normal operation, an output signal corresponding to input signals input to an input terminal INA and an input terminal INB of the NOR circuit 3 is output to the output terminal OUT as in the general negative logical product circuit. Even in the NOR circuit 3, as in the inverter circuit 1, the transmission (output) of an internal signal including a single event transient generated in one of the transistors in the OFF state in accordance with the incident high-energy charged particles E to the output terminal OUT is eliminated or reduced by the transmission gate circuit that is turned off by the incident charged particles E.

FIG. 8 is an example of a D-type flip-flop circuit (hereinafter referred to as a "D-FF"circuit") including six inverter circuits 1 (inverter circuits 1-1 to 1-6) and four transmission gates TMG (transmission gates TMG-1 to TMG-4). The D-FF circuit 4 shown in FIG. 8 has a configuration in which each inverter circuit (NOT circuit) is replaced with the inverter circuit 1 of the first embodiment in a general D-type flip-flop circuit including six inverter circuits (NOT circuits) and four transmission gates TMG. In FIG. 8, components provided in the inverter circuits 1-1 to 1-6 are denoted by logic gate symbols. The D-FF circuit 4 shown in FIG. 8 is an example in which each transistor is formed on a P-type single crystal semiconductor substrate.

Even in the D-FF circuit 4, in the normal operation, as in a general D-type flip-flop circuit, a change in the state of the input signal input to the input terminal D is delayed in accordance with a clock signal CLK and is output to the output terminal Q and the state of the output terminal Q is held. More specifically, the D-FF circuit 4 takes in the input signal of the input terminal D at the timing of a falling edge of the clock signal CLK and outputs it to the output terminal Q at the timing of a rising edge of the clock signal CLK and the D-FF circuit 4 holds the output state of the output signal for the output terminal Q when the clock signal CLK is in another state. In FIG. 8, a clock signal CLKB is an inverted clock signal associated with the clock signal CLK. In the D-FF circuit 4, in each inverter circuit 1, the transmission (output) of an internal signal including a single event transient generated in one of the transistors in the OFF state in accordance with the incident high-energy charged particles E to the output terminal Q is eliminated or reduced by the transmission gate circuit that is turned off by the incident charged particles E. Thereby, a single event upset in which erroneous data is stored in the D-FF circuit 4 can be prevented. Although the D-FF circuit 4 configured to prevent a single event upset by replacing the six inverter circuits (NOT circuits) with the inverter circuit 1 is shown in FIG. 8, the four transmission gates TMG included in the D-FF circuit 4 may also have a configuration in which a transmission gate circuit that is turned off by the incident charged particles E is connected.

The operation when a single event transient is eliminated or reduced in each of the CMOS circuits shown in FIGS. 6 to 8 can be easily understood on the assumption that it is similar to an operation when high-energy charged particles are incident on the inverter circuit 1 shown in FIGS. 3 to 5. Accordingly, a detailed description of the operation when the single event transient is eliminated or reduced in each of the CMOS circuits shown in FIGS. 6 to 8 will be omitted. Furthermore, as described above, the CMOS circuit may have various configurations other than those of the CMOS circuits shown in FIGS. 6 to 8. It is only necessary for these configurations to be equivalent to the configurations of the inverter circuit 1 shown in FIG. 1 and the CMOS circuits (the NAND circuit 2, the NOR circuit 3, and the D-FF circuit 4) shown in FIGS. 6 to 8. Furthermore, as described above, the CMOS circuit is also conceivable as a memory configuration in which data (a signal level) is stored by combining a plurality of single logical operation circuits, flip-flop circuits, transmission gate circuits, and the like, for example, as in SRAM. A transmission gate circuit constituting the memory is a component for implementing the function of the memory. Thus, the transmission gate circuit constituting the memory may also be connected to a transmission gate circuit for eliminating or reducing the single event transient. These operations can be easily understood on the assumption that they are similar to operations when the high-energy charged particles are incident on the inverter circuit 1 shown in FIGS. 3 to 5. Accordingly, a detailed description of various configurations and operations conceivable in the CMOS circuits will be omitted.

As described above, in the CMOS circuit of the first embodiment, it is assumed that the output terminal of the logical operation circuit having the basic configuration is connected to the transmission gate circuit that is turned off by incident charged particles E and the output terminal of the transmission gate circuit is the output terminal of the CMOS circuit. According to this configuration, in the CMOS circuit of the first embodiment, the transmission (output) of a single event transient generated in the logical operation circuit in accordance with the incident charged particles E to the output terminal is eliminated or reduced. Thereby, in the CMOS circuit of the first embodiment, it is possible to prevent a single event transient generated inside of the CMOS circuit from propagating to, for example, another CMOS circuit connected to a stage subsequent to the CMOS circuit. Furthermore, in the CMOS circuit of the first embodiment, it is possible to prevent a single event upset in which erroneous data is stored due to propagation of a single event transient generated inside of the CMOS circuit. In other words, it is possible to implement a CMOS circuit having high resistance to incident charged particles E.

Thereby, even if the semiconductor integrated circuit having the functions implemented by the CMOS circuit of the first embodiment is used in an environment, such as outer space, where high-energy charged particles E are incident, it is possible to reduce the possibility of malfunction. In other words, it is possible to implement a highly reliable semiconductor integrated circuit that is less likely to malfunction due to the influence of the usage environment by implementing the functions in the CMOS circuit of the first embodiment. Thus, even if the semiconductor integrated circuit having the functions implemented by the CMOS circuit of the first embodiment can be used in environments where high reliability is required even in places other than outer space, for example, such as in industrial equipment, automotive, and medical applications, effects can be obtained.

In the CMOS circuit of the first embodiment, a configuration in which the transmission gate circuit is turned off by the incident charged particles E by connecting wells of transistors of different conductivity types provided in a logical operation circuit having a basic configuration to the gate terminals of transistors provided in the transmission gate circuit is shown. However, the configuration in which the transmission gate circuit is turned off by the incident charged particles E may be another configuration.

Second Embodiment

A CMOS circuit of a second embodiment will be described below. Even in the following description, for ease of description, a logical negation circuit (an inverter circuit), which is a simplest logical operation circuit, will be described as an example of the CMOS circuit of the second embodiment.

[Configuration of Inverter Circuit]

Figure 9:
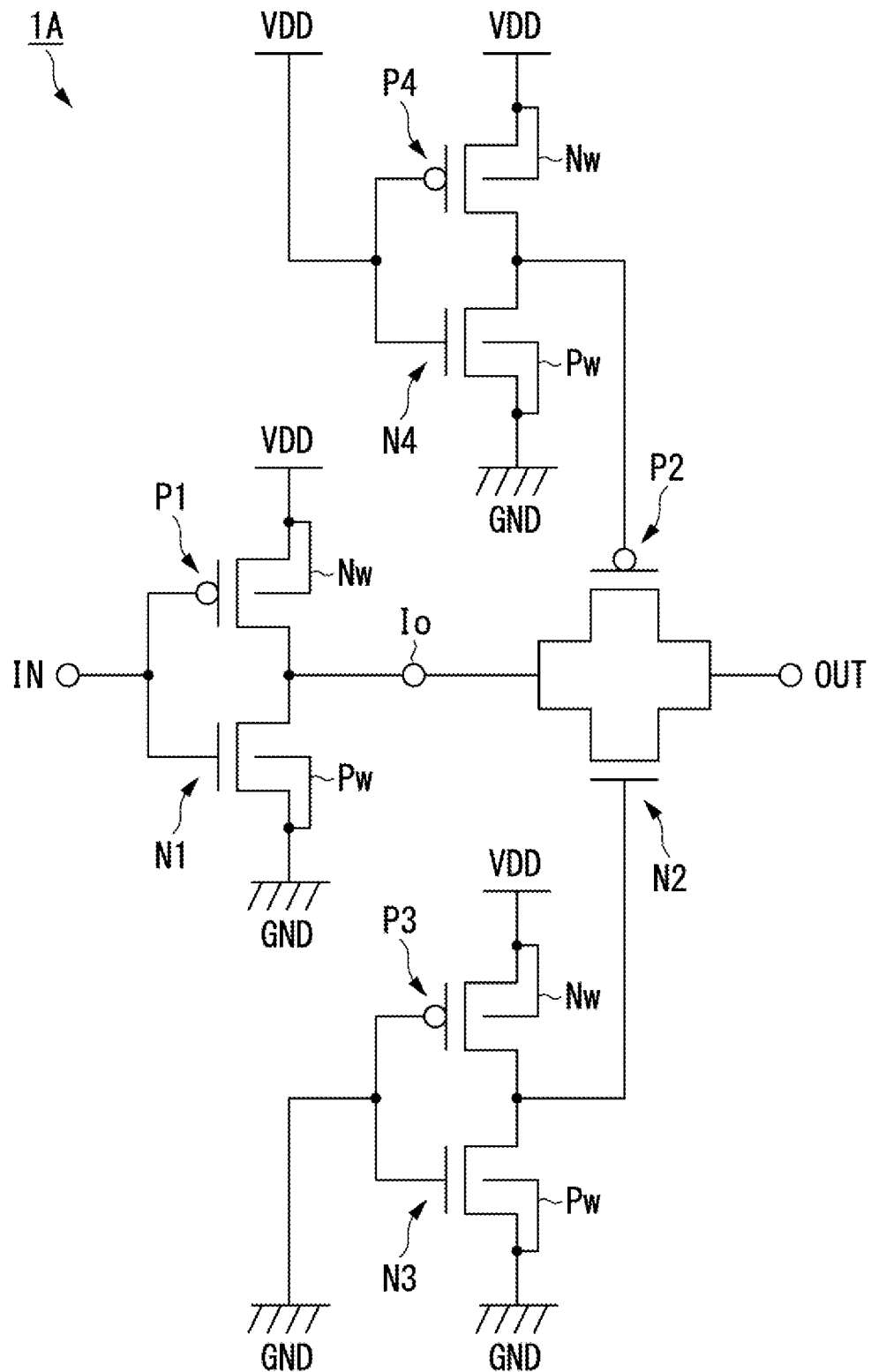
FIG. 9 is a diagram showing an example of a configuration of a CMOS circuit according to a second embodiment.

FIG. 9 is a diagram showing an example of a configuration of the CMOS circuit (the inverter circuit) according to the second embodiment. An inverter circuit TA includes a P-channel MOS transistor PT, an N-channel MOS transistor N1, a P-channel MOS transistor P2, an N-channel MOS transistor N2, a P-channel MOS transistor P3, an N-channel MOS transistor N3, a P-channel MOS transistor P4, and an N-channel MOS transistor N4. The inverter circuit TA shown in FIG. 9 is an example in which each transistor is formed on a P-type single crystal semiconductor substrate.

In the inverter circuit TA, each of a configuration of the P-channel MOS transistor P1 and the N-channel MOS transistor N1, a configuration of the P-channel MOS transistor P3 and the N-channel MOS transistor N3, and a configuration of the P-channel MOS transistor P4 and the N-channel MOS transistor N4 is a general logical negation circuit (NOT circuit). An input terminal of the NOT circuit including the P-channel MOS transistor P1 and the N-channel MOS transistor N1 is connected to an input terminal IN as in the NOT circuit provided in the inverter circuit 1 of the first embodiment. An internal node Io of the output terminal of this NOT circuit is connected to the input terminal of a transmission gate circuit including the P-channel MOS transistor P2 and the N-channel MOS transistor N2. An input terminal of a NOT circuit (hereinafter referred to as a "NOT circuit A") including a P-channel MOS transistor P3 and an N-channel MOS transistor N3 is connected to the ground GND and an output terminal thereof is connected to the gate terminal of the N-channel MOS transistor N2 constituting the transmission gate circuit. An input terminal of a NOT circuit (hereinafter referred to as a "NOT circuit B") including the P-channel MOS transistor P4 and the N-channel MOS transistor N4 is connected to a power supply VDD and an output terminal thereof is connected to the gate terminal of the P-channel MOS transistor P2 constituting the transmission gate circuit. A well of the P-channel MOS transistor P1, the P-channel MOS transistor P3, and the P-channel MOS transistor P4 is a common N-well Nw. A well of the N-channel MOS transistor N1, the N-channel MOS transistor N3, and the N-channel MOS transistor N4 is a common P-well Pw. A connection between the gate terminal of the N-channel MOS transistor N2 and the output terminal of the NOT circuit A and a connection between the gate terminal of the P-channel MOS transistor P2 and the output terminal of the NOT circuit B may be made in a wiring process, for example, in a process of manufacturing the CMOS-type semiconductor integrated circuit. The output terminal of the transmission gate circuit including the P-channel MOS transistor P2 and the N-channel MOS transistor N2 is connected to an output terminal OUT as in the transmission gate circuit provided in the inverter circuit 1 of the first embodiment.

The P-channel MOS transistor P3 is an example of a "fifth transistor" in the claims and the N-channel MOS transistor N3 is an example of a "sixth transistor" in the claims. The NOT circuit A is an example of a "second logical operation circuit" in the claims. The P-channel MOS transistor P4 is an example of a "seventh transistor" in the claims and the N-channel MOS transistor N4 is an example of an "eighth transistor" in the claims. The NOT circuit B is an example of a "second logical operation circuit" in the claims.

In the normal operation of the inverter circuit TA, a "High" level (for example, a VDD level) is output all the time because the input terminal of the NOT circuit A is fixed to the ground GND and a "Low" level (for example, a GND level) is output all the time because the input terminal of the NOT circuit B is fixed to the power supply VDD. Accordingly, the P-channel MOS transistor P2 and the N-channel MOS transistor N2 of the transmission gate circuit are turned on all the time. Thus, in the normal operation of the inverter circuit TA, the internal signal output to the internal node Io by the NOT circuit is transmitted at a timing delayed by a prescribed delay time in the transmission gate circuit and output to the output terminal OUT.

On the other hand, even in the inverter circuit TA, if high-energy charged particles E are incident, a single event transient corresponding to the charge of the incident charged particles E occurs in one of the transistors in the OFF state provided in the inverter circuit TA. Thus, even in the inverter circuit TA, due to a reason similar to that described in the first embodiment, the potential level of the N-well Nw common to the P-channel MOS transistors is lowered and the potential level of the P-well Pw common to the N-channel MOS transistors is raised. Thereby, in the inverter circuit 1A, the NOT circuit A outputs the "Low" level and the NOT circuit B outputs the "High" level. Thereby, even in the inverter circuit TA, the transmission gate circuit is turned off in accordance with the incident high-energy charged particles E as in the inverter circuit 1 of the first embodiment. Thereby, even in the inverter circuit TA, as in the inverter circuit 1 of the first embodiment, the transmission (output) of an internal signal including a single event transient generated in one of the transistors in the OFF state in accordance with the incident high-energy charged particles E to the output terminal OUT is eliminated or reduced by the transmission gate circuit that is turned off by the incident charged particles E.

[Another Configuration of Inverter Circuit]

Figure 10:
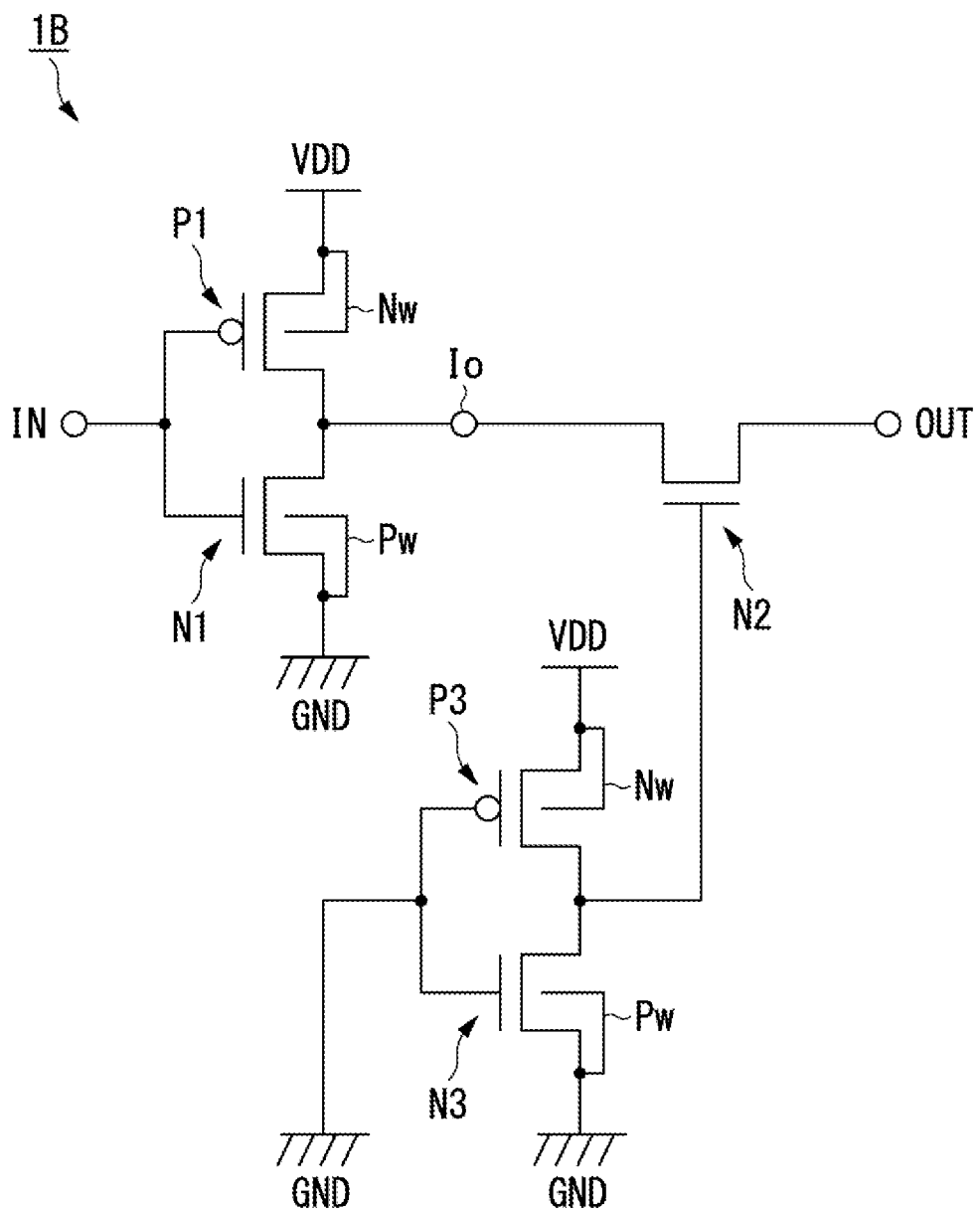
FIG. 10 is a diagram showing another example of the configuration of the CMOS circuit according to the second embodiment.

FIG. 10 is a diagram showing another example of the configuration of the CMOS circuit (the inverter circuit) according to the second embodiment. An inverter circuit 1B includes a P-channel MOS transistor P1, an N-channel MOS transistor N1, an N-channel MOS transistor N2, a P-channel MOS transistor P3, and an N-channel MOS transistor N3. The inverter circuit 1B shown in FIG. 10 is an example in which each transistor is formed on a P-type single crystal semiconductor substrate.

In the inverter circuit 1B, the transmission gate circuit provided in the inverter circuit TA includes only the N-channel MOS transistor N2 and hence the NOT circuit B is eliminated. Thus, the inverter circuit 1B can constitute a CMOS circuit having a smaller circuit scale than the inverter circuit 1A.

Although the configuration of the inverter circuit 1B is different from the configuration of the transmission gate circuit, its operation is similar to that of the inverter circuit TA. Accordingly, even in the inverter circuit 1B, as in the inverter circuit 1 and the inverter circuit TA, the transmission (output) of an internal signal including a single event transient generated in one of the transistors in the OFF state in accordance with the incident high-energy charged particles E to the output terminal OUT is eliminated or reduced by the transmission gate circuit that is turned off by the incident charged particles E.

As described above, in the CMOS circuit of the second embodiment, a transmission gate circuit that is turned off by output signals of the NOT circuit A and/or the NOT circuit B including transistors having a common well is connected to the output terminal of the logical operation circuit having the basic configuration and the output terminal of the transmission gate circuit is used as the output terminal of the CMOS circuit. According to this configuration, in the CMOS circuit of the second embodiment, the transmission (output) of a single event transient generated in the logical operation circuit in accordance with the incident charged particles E to the output terminal is eliminated or reduced. Here, it can be considered that the operation of turning off the transmission gate circuit in the CMOS circuit of the second embodiment is an operation based on a process of indirectly detecting the change in the potential level of the well. This is because the transmission gate circuit is turned off by directly detecting a change in the potential level of the well when the well is directly connected to the gate terminal of each transistor provided in the transmission gate circuit in the inverter circuit 1 of the first embodiment, whereas the transmission gate circuit is turned off according to a change in the potential level of the output signal of each of the NOT circuit A and/or the NOT circuit B having the common well in the CMOS circuit of the second embodiment. In this way, although there is a difference between a direct mode and an indirect mode, the transmission gate circuit is turned off by detecting a change in the potential level of the well due to the incident high-energy charged particles E even in the CMOS circuit of the second embodiment. Thereby, even in the CMOS circuit of the second embodiment, as in the CMOS circuit of the first embodiment, the transmission (output) of an internal signal including a single event transient generated in one of the transistors in the OFF state in accordance with the high-energy charged particles E incident on the CMOS circuit to the output terminal OUT is eliminated or reduced.

Thereby, even in the CMOS circuit of the second embodiment, as in the CMOS circuit of the first embodiment, it is possible to prevent a single event transient generated inside of the CMOS circuit from propagating to, for example, another CMOS circuit connected to a stage subsequent to the CMOS circuit, and it is possible to prevent a single event upset in which erroneous data is stored due to propagation of a single event transient that has been generated. That is, even in the CMOS circuit of the second embodiment, as in the CMOS circuit of the first embodiment, resistance to the incidence of charged particles E can be enhanced. Thereby, even in the CMOS circuit of the second embodiment, it is possible to implement a highly reliable semiconductor integrated circuit that is less likely to malfunction due to the influence of the usage environment.

As described above, according to the CMOS circuit of each embodiment, even if a single event transient occurs in the logical operation circuit due to the incidence of high-energy charged particles of radiation from the usage environment, the transmission (output) of the single event transient that has occurred to the output terminal OUT can be eliminated or reduced. Thereby, the semiconductor integrated circuit having the functions implemented by the CMOS circuit of each embodiment can reduce the possibility of malfunction even if it is used in an environment where high-energy charged particles are incident and high reliability can be obtained.

In each of the above-described embodiments, an example of the case where the transistors provided in the CMOS circuit are formed on a P-type single crystal semiconductor substrate (bulk substrate) has been described. However, the semiconductor substrate may have various structures such as an N-type single crystal substrate and a P-type or N-type SOI structure substrate in addition to the P-type single crystal substrate. In this case, it is only necessary for the configuration and operation of the CMOS circuit to be equivalent to the configuration and operation of the CMOS circuit formed on the P-type single crystal semiconductor substrate described above. Accordingly, a detailed description of the configuration and operation when the CMOS circuit is formed on a semiconductor substrate different from the P-type single crystal semiconductor substrate will be omitted.

Although modes for carrying out the present invention have been described using embodiments, the present invention is not limited to the embodiments, and various modifications and substitutions can also be made without departing from the scope and spirit of the present invention.

REFERENCE SIGNS LIST 1, 1-1, 1-2, 1-3, 1-4, 1-5, 1-6, TA, 1B Inverter circuit
2 NAND circuit
3 NOR circuit
4 D-FF circuit
P1, PTA, P1B, P2, P3, P4 P-channel MOS transistor
N1, N1A, NIB, N2, N3, N4 N-channel MOS transistor
Pw P-well
Nw N-well
Io Internal node

The invention claimed is:

1. A complementary metal oxide semiconductor (CMOS) circuit including a first logical operation circuit formed on a substrate of a first conductivity type and a transmission circuit for transmitting a signal of an output terminal of the first logical operation circuit,
  wherein the first logical operation circuit includes a combination of a first transistor of the first conductivity type having a first well of a second conductivity type different from the first conductivity type and a second transistor of the second conductivity type having a second well of the first conductivity type,
  wherein the transmission circuit includes a third transistor of the first conductivity type and a fourth transistor of the second conductivity type, both of the third transistor of the first conductivity type and the fourth transistor of the second conductivity type being connected to the output terminal of the logical operation circuit, and
  wherein each of gate terminals of the third transistor and the fourth transistor is connected to a well of a transistor of a different conductivity type between the first transistor and the second transistor or an output terminal of a second logical operation circuit that includes a combination of a fifth transistor of the first conductivity type having the first well and a sixth transistor of the second conductivity type having the second well and that has an input terminal fixed to a prescribed potential.

2. The CMOS circuit according to claim 1,
  wherein the gate terminal of the third transistor is connected to the second well of the second transistor, and
  wherein the gate terminal of the fourth transistor is connected to the first well of the first transistor.

3. The CMOS circuit according to claim 1,
  wherein the second logical operation circuit further includes a combination of a seventh transistor of the first conductivity type having the first well and an eighth transistor of the second conductivity type having the second well,
  wherein the gate terminal of the third transistor is connected to a first output terminal to which a drain terminal of the seventh transistor and a drain terminal of the eighth transistor are connected and a first input terminal to which a gate terminal of the seventh transistor and a gate terminal of the eighth transistor are connected is fixed to a power supply potential, and wherein the gate terminal of the fourth transistor is connected to a second output terminal to which a drain terminal of the fifth transistor and a drain terminal of the sixth transistor are connected and a second input terminal to which a gate terminal of the fifth transistor and a gate terminal of the sixth transistor are connected is fixed to a ground potential.

4. The CMOS circuit according to claim 1,
wherein the transmission circuit includes the fourth transistor, and
wherein the gate terminal of the fourth transistor is connected to the output terminal to which a drain terminal of the fifth transistor and a drain terminal of the sixth transistor are connected and the input terminal to which a gate terminal of the fifth transistor and a gate terminal of the sixth transistor are connected is fixed to a ground potential.

5. The CMOS circuit according to claim 1, wherein the second logical operation circuit is a logical negation circuit.

6. The CMOS circuit according to claim 1,
wherein the first conductivity type is a P type, and
wherein the second conductivity type is an N type.

7. The CMOS circuit according to claim 1, wherein the third transistor of the first conductivity type is directly connected to the output terminal of the logical operation circuit, and the fourth transistor of the second conductivity type is directly connected to the output terminal of the logical operation circuit.

* * * * *